United States Patent
Wu

(10) Patent No.: US 6,952,348 B2
(45) Date of Patent: Oct. 4, 2005

(54) HEAT SINK ASSEMBLY INCORPORATING MOUNTING FRAME

(75) Inventor: Wow Wu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/816,134

(22) Filed: Mar. 31, 2004

(65) Prior Publication Data

US 2004/0252461 A1 Dec. 16, 2004

(30) Foreign Application Priority Data

Jun. 11, 2003 (TW) .................................... 92210677 U

(51) Int. Cl.⁷ ................................................ H05K 7/20
(52) U.S. Cl. ...................... 361/719; 361/704; 257/718; 257/719; 257/727
(58) Field of Search ................................ 361/704, 707, 361/709–711, 717–719; 257/706, 712, 718, 719, 727; 174/16.1, 16.3; 165/80.3, 185

(56) References Cited

U.S. PATENT DOCUMENTS

| | | | | |
|---|---|---|---|---|
| 5,184,211 A | * | 2/1993 | Fox | 257/706 |
| 5,805,430 A | * | 9/1998 | Atwood et al. | 361/829 |
| 5,897,917 A | | 4/1999 | Hinshaw et al. | |
| 6,049,458 A | * | 4/2000 | Lee et al. | 361/705 |
| 6,205,026 B1 | * | 3/2001 | Wong et al. | 361/704 |
| 6,644,395 B1 | * | 11/2003 | Bergin | 165/185 |
| 6,835,453 B2 | * | 12/2004 | Greenwood et al. | 428/343 |

* cited by examiner

Primary Examiner—Boris Chervinsky
(74) Attorney, Agent, or Firm—Wei Te Chung

(57) ABSTRACT

A heat sink assembly includes a heat sink (10), a mounting frame (20) for mounting the heat sink to an electronic component (60), and a grease cover (40). The heat sink includes a base (12) on which thermal grease (16) is spread. The mounting frame includes a body (22) defining an opening (24) for extension of the electronic component therethrough to contact the base. The body includes longitudinal and lateral beams (25, 27) surrounding the electronic component. A plurality of fasteners (26) is formed on the longitudinal beams and engaged in cutouts (16) defined in the base, respectively. The grease cover is detachably attached to the mounting frame, and includes a main portion (42) covering the opening of the mounting frame and the thermal grease, and an ear (44) extending from the main portion beyond one border of the mounting frame for facilitating operation of the grease cover.

20 Claims, 4 Drawing Sheets

HEAT SINK ASSEMBLY INCORPORATING MOUNTING FRAME

BACKGROUND OF THE INVENTION

1. Field of the Invention

The present invention relates to a heat sink assembly, and particularly to a heat sink assembly having a mounting frame which can readily mount a grease cover to a heat sink.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal operating temperature ranges, thereby assuring the quality of data management, storage and transfer.

To improve heat conductivity between a heat sink and a CPU, thermal interface material such as thermal grease is often applied to a bottom face of the heat sink. However, thermal grease cannot be applied to the heat sink in advance since it is not solid at ambient temperature and may contaminate surrounding articles or be contaminated by dust or foreign particles before the heat sink is attached to the CPU. Conventionally, the thermal grease is spread onto the heat sink just prior to attachment of the heat sink to the CPU. This operation extends the time needed for said attachment.

To overcome the above problem, various grease covers have been developed. U.S. Pat. No. 6,049,458 discloses a grease cover attached to a bottom face of a heat sink to enclose thermal grease spread on the bottom of the heat sink. The thermal grease cannot be contaminated by dust or foreign particles, and does not contaminate surrounding articles when the heat sink is transported or handled. By using the grease cover, the thermal grease can be applied to the heat sink in advance, thereby simplifying the process of attachment of the heat sink to the CPU. However, the grease cover is attached to the bottom face of the heat sink by adhesive. The adhesive must be cleaned from the heat sink before the heat sink is attached to the CPU. This is unduly inconvenient.

Another difficulty relating to the attachment of a heat sink to a CPU is as follows. Oftentimes, a clip is required for mounting the heat sink to the CPU. In earlier times, a linear type of wire clip was widely used. The linear clip is received in a groove defined between two adjacent medial fins of the heat sink, and is engaged with a circuit board on which the CPU is mounted. However, in many modern applications such as when a large heat sink is used, the linear clip cannot firmly retain the heat sink against the CPU. Accordingly, wider plate-type clips were subsequently developed. The plate-type clip is received in a specially widened groove defined between two adjacent medial fins of a heat sink, and engaged with the circuit board. However, the widened groove takes up space that would otherwise be utilized to provide more fins for the heat sink. In effect, the plate-type clip reduces a heat dissipating area of the heat sink, and reduces the heat dissipating capability of the heat sink. Further, combinations of the plate-type clip with a retention module were developed. The retention module is mounted on a circuit board, and a pair of plate-type clips presses on opposite sides of the heat sink and engages with the retention module. However, use of the retention module increases the number of parts of the assembly, and inflates costs.

SUMMARY OF THE INVENTION

Accordingly, an object of the present invention is to provide a heat sink assembly incorporating a mounting frame which can readily and conveniently mount a grease cover to a heat sink.

Another object of the present invention is to provide a heat sink assembly which allows a heat dissipating area of the heat sink to be maximized, and which is convenient and inexpensive.

To achieve the above-mentioned objects, a heat sink assembly in accordance with the present invention comprises a heat sink, a mounting frame for mounting the heat sink to an electronic component, and a grease cover. The heat sink comprises a base on which thermal grease is spread. The mounting frame includes a body defining an opening for receiving the electronic component therethrough such that the electronic component contacts the base. The body comprises a plurality of longitudinal and lateral beams surrounding the electronic component. Each of the longitudinal beams defines a groove. A plurality of fasteners is formed on a top face of the longitudinal beams and engaged in cutouts defined in the base, respectively. The grease cover comprises a main portion covering the opening of the mounting frame and the thermal grease, a pair of flanges extending from opposite sides of the main portion, and an ear extending from beyond one border of the mounting frame. The flanges are fittingly received in the grooves of the mounting frame thereby detachably attaching the grease cover to the mounting frame. After the grease cover is lifted away from the mounting frame, the combined mounting frame and heat sink can directly be attached to the circuit board by way of the mounting frame without additional process.

Other objects, advantages and novel features of the present invention will be drawn from the following detailed description of a preferred embodiment of the present invention with attached drawings, in which:

DETAILED DESCRIPTION OF THE INVENTION

Figure 1:
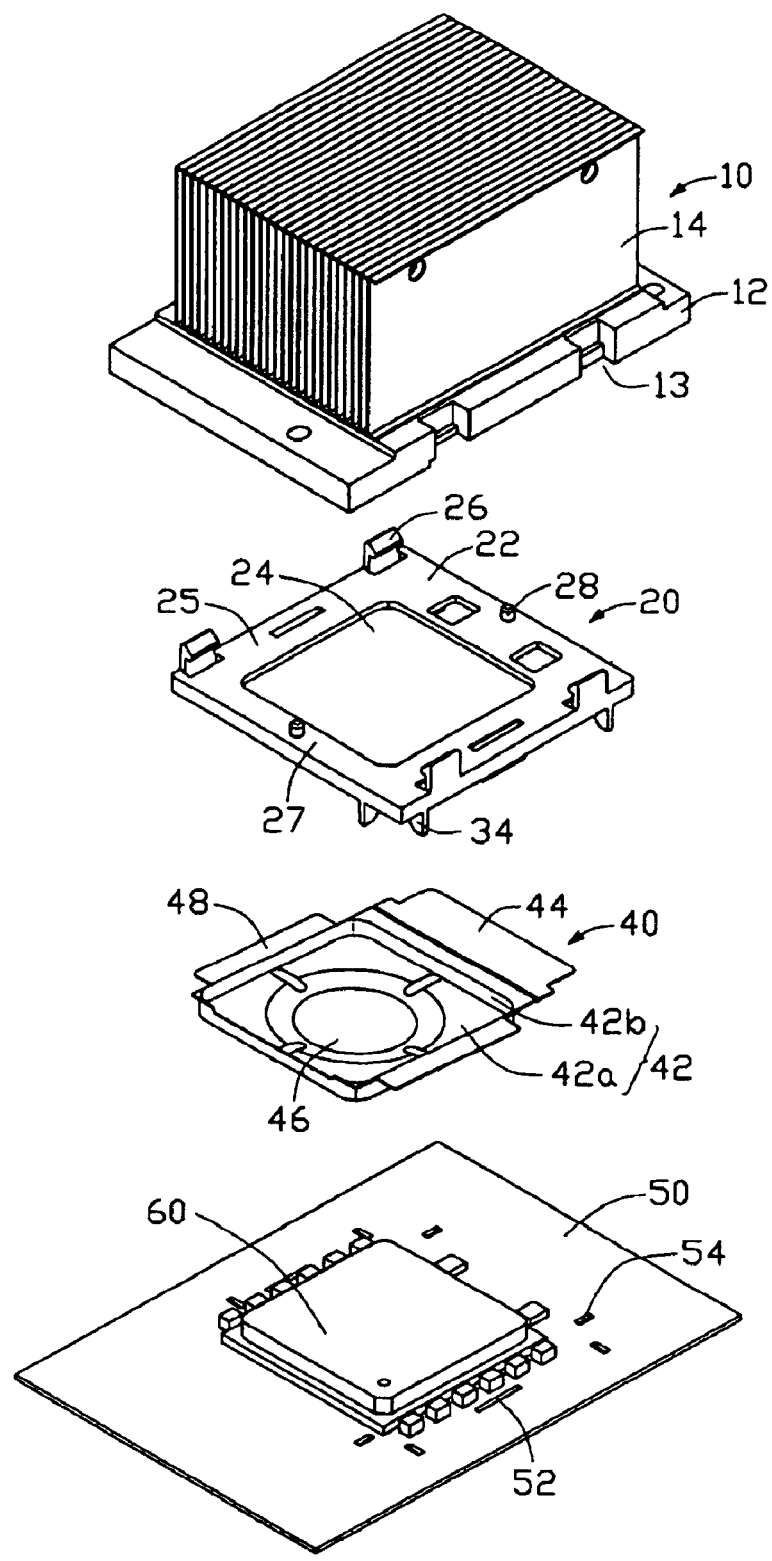
FIG. 1 is an exploded, isometric view of a heat sink assembly in accordance with a preferred embodiment of the present invention together with an electronic component mounted on a circuit board, the heat sink assembly comprising a heat sink, a mounting frame, and a grease cover.
Figure 2:
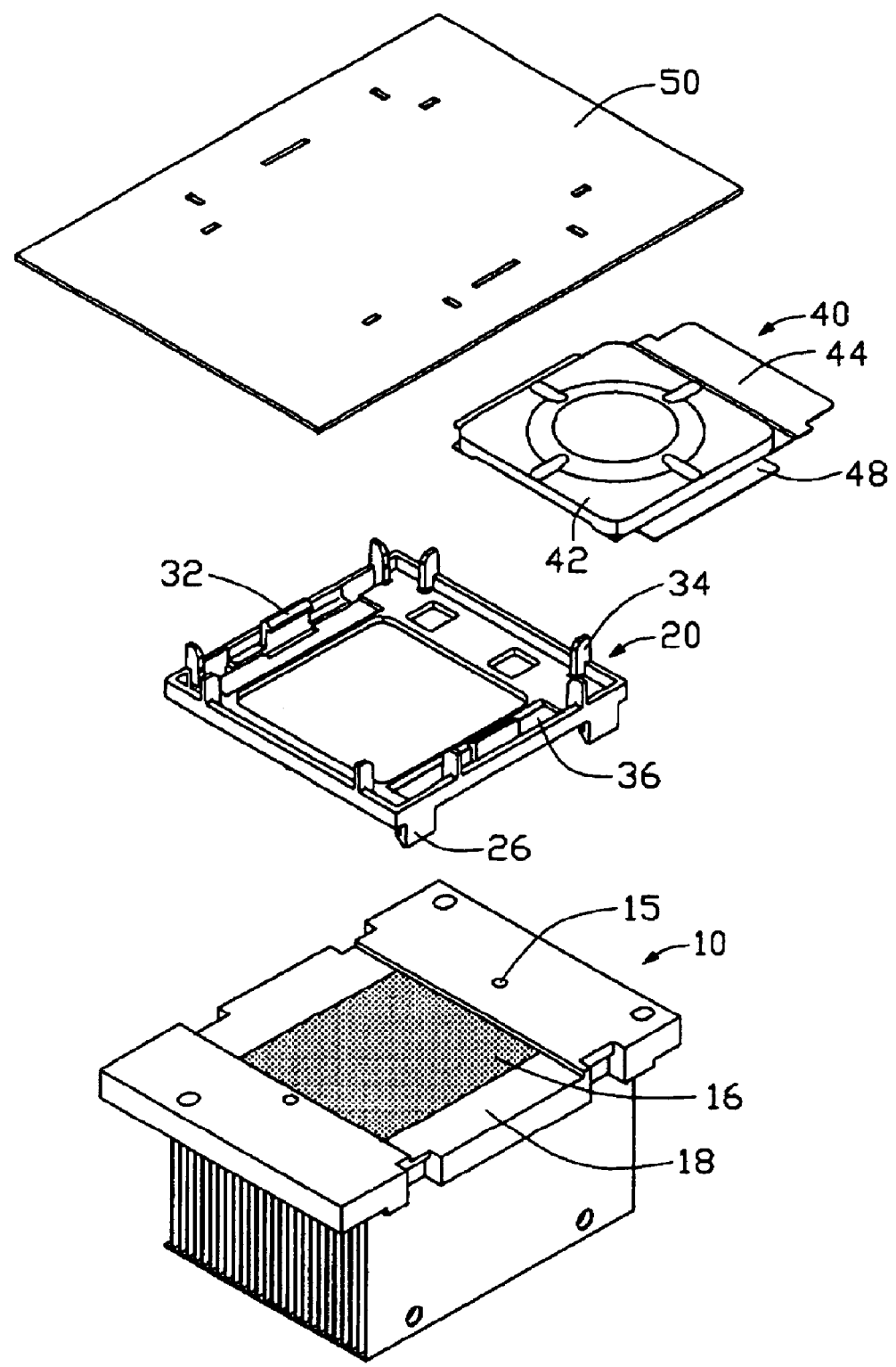
FIG. 2 is similar to FIG. 1, but showing the components thereof inverted.

FIGS. 1–2 show a heat sink assembly in accordance with the preferred embodiment of the present invention, together with an electronic component 60 mounted on a circuit board 50. The electronic component 60 may, for example, be a CPU. A pair of locking slots 52 is defined in the circuit board 50 on opposite longitudinal sides of the electronic component 60 respectively. Four pairs of locating openings 54 are defined in the circuit board 50, adjacent four corners of the electronic component 60 respectively. The locating openings 54 in each pair of locating openings 54 are oriented perpendicular to each other.

Referring also to FIG. 2, the heat sink assembly comprises a heat sink 10, a mounting frame 20, and a grease cover 40. The heat sink 10 comprises a base 12, and a plurality of parallel fins 14 extending upwardly from the base 12. A pair of cutouts 13 is defined in each of opposite longitudinal side edges of the base 12. A pair of holes 15 is defined in a bottom face of the base 12, at opposite lateral side portions of the base 12 respectively. A recessed portion 18 is formed in a middle of the bottom of the base 12. Thermal grease 16 is spread on a center part of the recessed portion 18.

The mounting frame 20 comprises a main body 22. An opening 24 is defined in a middle of the body 22. A pair of longitudinal beams 25 and a pair of lateral beams 27 are thus formed around the opening 24. A pair of fasteners 26 is formed on respective opposite ends of a top face of each longitudinal beam 25, for engaging in corresponding cutouts 13 of the heat sink 10. A post 28 is formed on a middle of a top face of each lateral beam 27, for being received in a corresponding hole 15 of the heat sink 10. A latch 32 is formed on a bottom face of each longitudinal beam 25, for engaging in a corresponding locking slot 52 of the circuit board 50. Four pairs of feet 34 are formed on four corner portions of a bottom face of the body 22, for engaging in the locating openings 54 of the circuit board 50. A groove 36 is defined in a bottom face of each longitudinal beam 25.

The grease cover 40 is made by pressing a pliable plastic sheet so that it has a low-profile generally parallelepiped configuration. The grease cover 40 comprises a main portion 42. The main portion 42 comprises a bottom plate 42a, and four side walls 42b extending upwardly from a periphery of the bottom plate 42a. The bottom plate 42a and the side walls 42b cooperatively define a cavity (not labeled) therebetween. A recess 46 is defined in a center of the bottom plate 42a of the main portion 42, in communication with the cavity. A pair of flanges 48 extends horizontally outwardly from two longitudinal of the side walls 42b respectively. The flanges 48 correspond to the grooves 36 of the mounting frame 20. An ear 44 extends horizontally outwardly from a lateral one of the side walls 42b that is between the longitudinal side walls 42b.

Figure 3:
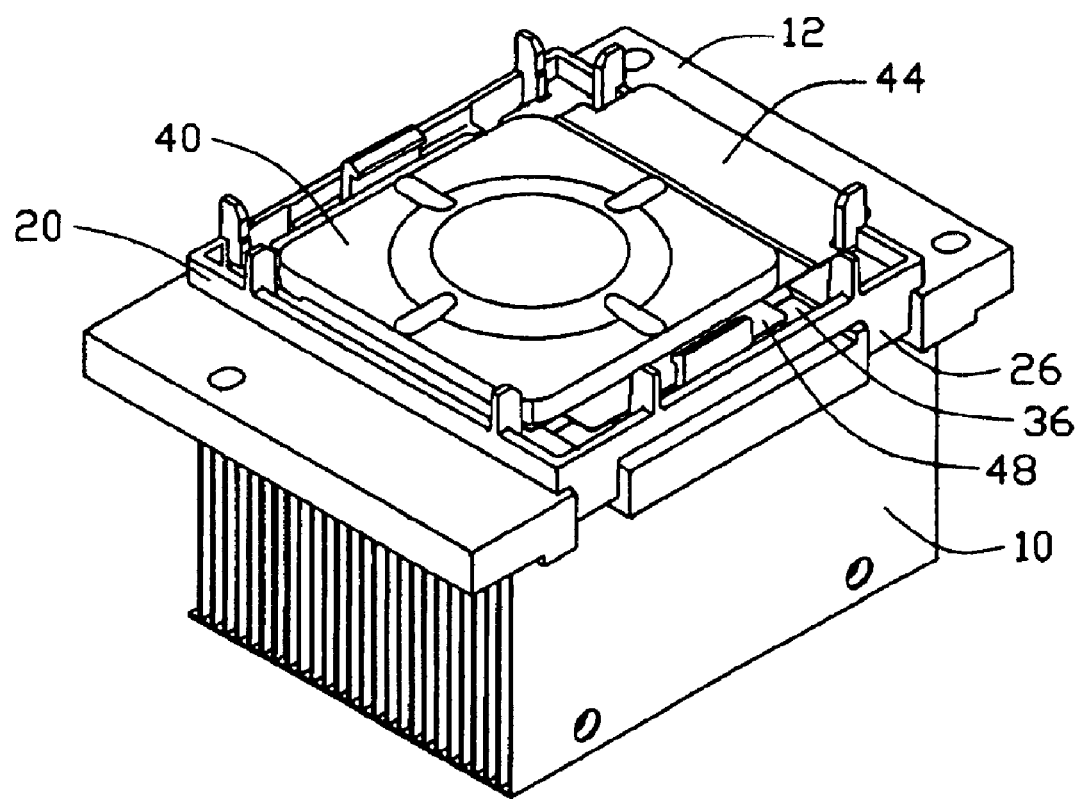
FIG. 3 is an assembled view of the heat sink assembly of FIG. 2.

Referring also to FIG. 3, in assembly, the mounting frame 20 is mounted onto the bottom face of the base 12 of the heat sink 10. The posts 28 are fittingly received in the holes 15 of the heat sink 10. The fasteners 26 of the mounting frame 20 are snappingly engaged in the cutouts 13 of the heat sink 10. The opening 24 of the mounting frame 20 is aligned with the thermal grease 16 on the heat sink 10. The grease cover 40 is then mounted to a bottom of the mounting frame 20. The flanges 48 of the grease cover 40 are fittingly received in the grooves 36 of the mounting frame 20. The main portion 42 of the grease cover 40 encloses the opening 24 of the mounting frame 20 and the thermal grease 16 on the heat sink 10. The ear 44 extends beyond a corresponding lateral beam 27 of the mounting frame 20.

Figure 4:
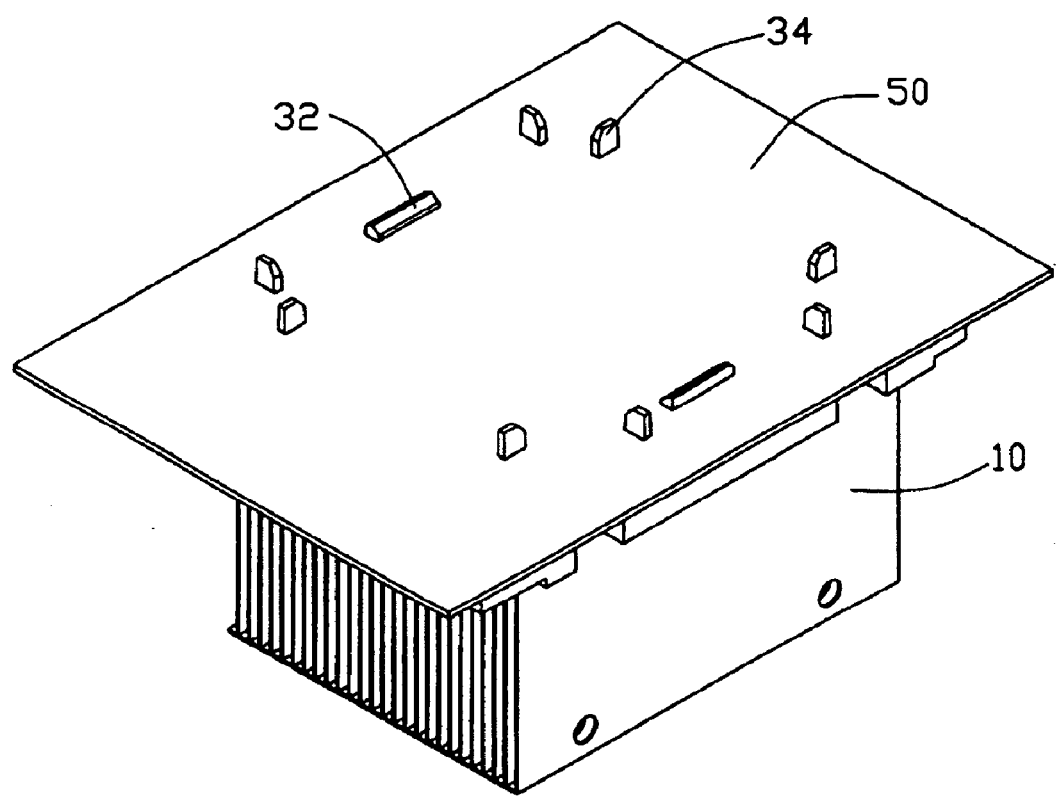
FIG. 4 is an assembled view of FIG. 2.

Referring to FIG. 4, in use, an operator clasps the ear 44 of the grease cover 40, and lifts the grease cover 40 up and away from the mounting frame 20. The combined heat sink 10 and mounting frame 20 is then mounted onto the circuit board 50, with the opening 24 of the mounting frame 20 receiving the electronic component 60 therein. The feet 34 are extended through the corresponding locating openings 54 of the circuit board 50, thereby locating the combined heat sink 10 and mounting frame 20 on the circuit board 50. The latches 32 are snappingly engaged in the locking slots 52 of the circuit board 50. Thus, the heat sink 10 is firmly and securely mounted onto the circuit board 50 by means of the mounting frame 20.

In the present invention, the grease cover 40 is attached on the mounting frame 20 by way of the flanges 48 being fittingly received in the grooves 36. Compare this with a conventional heat sink assembly, in which a grease cover is adhered to a heat sink with adhesive. That is, in the present invention, there is no inconvenience of cleaning adhesive off from the heat sink 10. In addition, because the grease cover 40 is made from pliable plastic material, it is easily and conveniently lifted up and away from the mounting frame 20. Furthermore, the mounting frame 20 is sandwiched between the heat sink 10 and the circuit board 50, and does not extend through any of the fins 14 of the heat sink 10. Because the fins 14 are unaltered, they provide a maximum possible heat dissipating area for the heat sink 10. Moreover, no additional auxiliary element (such as a retention module) is needed for the mounting frame 20 to mount the heat sink 10 to the circuit board 50.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat sink assembly for a heat generating component, the heat sink assembly comprising:
   a heat sink comprising a base having a bottom face for contacting the heat generating component;
   thermal grease spread on the bottom face;
   a mounting frame for mounting the heat sink to the heat generating component, the mounting frame defining an opening for receiving the heat generating component therethrough such that the heat generating component contacts the bottom face, the opening aligned with the thermal grease;
   locking means for locking the heat sink to the mounting frame; and
   a grease cover detachably attached to the mounting frame, the grease cover comprising a main portion covering the opening of the mounting frame and the thermal grease.

2. The heat sink assembly as claimed in claim 1, wherein the mounting frame comprises a pair of longitudinal beams on opposite longitudinal sides of the opening, and the locking means comprises a plurality of cutouts defined in opposite longitudinal sides of the base of the heat sink, and a plurality of fasteners formed on the longitudinal beams of the mounting frame and engaging in the cutouts.

3. The mounting frame assembly as claimed in claim 2, wherein the main portion of the grease cover comprises a bottom plate and a plurality of side walls cooperatively forming a cavity in communication with the opening of the mounting frame.

4. The mounting frame assembly as claimed in claim 3, wherein each of the longitudinal beams defines a groove, and the grease cover comprises a pair of flanges extending from first and second side walls thereof, the flanges being fittingly received in the grooves.

5. The mounting frame assembly as claimed in claim 4, wherein an ear extends from a third side wall of the main portion of the grease cover and beyond one corresponding border of the mounting frame, for facilitating operation of the grease cover.

6. The mounting frame assembly as claimed in claim 2, wherein the base of the heat sink defines a pair of holes in opposite lateral side portions thereof, the mounting frame further comprises a pair of lateral beams on opposite lateral sides of the opening, a pair of posts is formed on the lateral beams, and the posts are fittingly received in the holes.

7. An electronic device assembly comprising:
   a circuit board having an electronic component mounted thereon;
   a heat sink comprising a base having a bottom face;
   thermal grease spread on the bottom face of the base; and
   a unitary mounting frame for mounting the heat sink to the circuit board, the mounting frame comprising:
      a body defining an opening for extension of the electronic component therethrough to contact the bottom face on which the thermal grease is spread;
      locking means for locking the heat sink to the mounting frame; and
      latching means for latching the mounting frame to the circuit board; and
   a grease cover detachably attached to the mounting frame, the grease cover comprising a main portion covering the opening of the mounting frame and the thermal grease; wherein
   after the grease cover is detached from the mounting frame, the combined mounting frame and heat sink can directly be attached to the circuit board.

8. The electronic device assembly as claimed in claim 7, wherein the combined mounting frame and heat sink is attached to the circuit board by way of the mounting frame.

9. The electronic device assembly as claimed in claim 8, wherein the circuit board defines a pair of locking slots on opposite sides of the electronic component, the mounting frame comprises a pair of longitudinal beams at opposite longitudinal sides of the opening, and the latching means comprises a pair of latches formed on bottoms of the longitudinal beams and engaging in the locking slots.

10. The electronic device assembly as claimed in claim 8, wherein the circuit board defines a plurality of pairs of locating openings surrounding the electronic component, and the body of the mounting frame comprises a plurality of pairs of feet received in the locating openings respectively.

11. The electronic device assembly as claimed in claim 9, wherein the base of the heat sink defines a plurality of cutouts in opposite longitudinal sides thereof, and the locking means comprises a plurality of fasteners formed on the longitudinal beams and engaging in the cutouts.

12. The electronic device assembly as claimed in claim 9, wherein the base of the heat sink defines a pair of holes in opposite lateral side portions thereof, the mounting frame further comprises a pair of lateral beams at opposite lateral sides of the opening, a pair of posts is formed on the lateral beams, and the posts are fittingly received in the holes.

13. The electronic device assembly as claimed in claim 9, wherein each of the longitudinal beams defines a groove, and the grease cover comprises a pair of flanges extending from opposite first and second sides of the main portion thereof, the flanges being fittingly received in the grooves.

14. The electronic device assembly as claimed in claim 13, wherein an ear extends from a third side of the main portion of the grease cover and beyond one border of the mounting frame, for facilitating operation of the grease cover.

15. The electronic device assembly as claimed in claim 7, wherein a recessed portion is defined in the bottom face of the base, and the thermal grease is spread on the recessed portion.

16. A heat sink assembly comprising:
   a circuit board having an electronic component mounted thereon;
   a heat sink comprising a base with thermal grease spread on a surface thereof;
   a mounting frame essentially positioned under the surface of the base and defining an opening which allows one of the base and the electronic component to extend therethrough for contact with the other; and
   a grease cover detachably attached to the mounting frame and covering the opening of the mounting frame before the heat sink is mounted via the mounting frame to the circuit board.

17. The heat sink assembly of claim 16, wherein protrusions are extended from the mounting frame, the protrusions embracing the grease cover before the heat sink is mounted to the circuit board, and the protrusions extending through the circuit board when the heat sink is mounted to the circuit board.

18. The heat sink assembly of claim 17, wherein two of the protrusions snappingly latch the circuit board at a side thereof opposite to the electronic component when the heat sink is mounted to the circuit board.

19. The heat sink assembly of claim 16, wherein said mounting frame includes means attached to the heat sink, and means attached to the printed circuit board, respectively.

20. The heat sink assembly of claim 19, wherein both said means are integrally formed with the mounting frame.

* * * * *